United States Patent
Yasuda et al.

(10) Patent No.: US 10,658,314 B2
(45) Date of Patent: May 19, 2020

(54) WAFER LAMINATE, METHOD FOR PRODUCTION THEREOF, AND ADHESIVE COMPOSITION FOR WAFER LAMINATE

(71) Applicant: Shin-Etsu Chemical Co., Ltd., Tokyo (JP)

(72) Inventors: Hiroyuki Yasuda, Joetsu (JP); Michihiro Sugo, Joetsu (JP); Hideto Kato, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 42 days.

(21) Appl. No.: 15/728,846

(22) Filed: Oct. 10, 2017

(65) Prior Publication Data

US 2018/0102333 A1 Apr. 12, 2018

(30) Foreign Application Priority Data

Oct. 11, 2016 (JP) .................................. 2016-199829

(51) Int. Cl.
*B32B 7/06* (2019.01)
*H01L 21/683* (2006.01)
(Continued)

(52) U.S. Cl.
CPC ............ *H01L 24/04* (2013.01); *B32B 7/06* (2013.01); *B32B 7/12* (2013.01); *B32B 15/08* (2013.01);
(Continued)

(58) Field of Classification Search
None
See application file for complete search history.

(56) References Cited

U.S. PATENT DOCUMENTS 5,358,980 A * 10/1994 Shiobara .............. C08G 59/145
523/427
6,512,031 B1 * 1/2003 Honda ................... C08G 59/18
257/E21.503
(Continued)

FOREIGN PATENT DOCUMENTS

EP 2587530 A2 5/2013
EP 2738797 A2 6/2014
(Continued)

OTHER PUBLICATIONS

Extended European Search Report dated Apr. 3, 2018, issued in counterpart European Application No. 17195687.3. (11 pages).

*Primary Examiner* — Bo B Jang
(74) *Attorney, Agent, or Firm* — Westerman, Hattori, Daniels & Adrian, LLP

(57) ABSTRACT

Disclosed herein is a wafer laminate suitable for production of thin wafers and a method for producing the wafer laminate. The wafer laminate can be formed easily by bonding between the support and the wafer and it can be easily separated from each other. It promotes the productivity of thin wafers.
The wafer laminate includes a support, an adhesive layer formed on the support, and a wafer which is laminated on the adhesive layer in such a way that that surface of the wafer which has the circuit surface faces toward the adhesive layer, wherein the adhesive layer is a cured product of an adhesive composition composed of resin A and resin B, the resin A having the light blocking effect and the resin B having the siloxane skeleton.

9 Claims, 1 Drawing Sheet

(51) Int. Cl.
| | |
|---|---|
| *C08G 77/50* | (2006.01) |
| *B32B 15/08* | (2006.01) |
| *B32B 17/06* | (2006.01) |
| *C08G 77/52* | (2006.01) |
| *B32B 7/12* | (2006.01) |
| *H01L 23/00* | (2006.01) |
| *B32B 27/26* | (2006.01) |
| *B32B 27/28* | (2006.01) |
| *B32B 38/10* | (2006.01) |
| *B32B 27/20* | (2006.01) |
| *B32B 27/18* | (2006.01) |
| *B32B 27/24* | (2006.01) |
| *B32B 37/12* | (2006.01) |
| *C09J 163/00* | (2006.01) |
| *B32B 27/08* | (2006.01) |
| *C09J 183/10* | (2006.01) |
| *B32B 37/02* | (2006.01) |
| *C08G 77/00* | (2006.01) |
| *B32B 38/00* | (2006.01) |
| *B32B 37/00* | (2006.01) |

(52) U.S. Cl.
CPC ............ *B32B 17/064* (2013.01); *B32B 27/08* (2013.01); *B32B 27/18* (2013.01); *B32B 27/20* (2013.01); *B32B 27/24* (2013.01); *B32B 27/26* (2013.01); *B32B 27/28* (2013.01); *B32B 27/283* (2013.01); *B32B 37/02* (2013.01); *B32B 37/12* (2013.01); *B32B 38/10* (2013.01); *C08G 77/50* (2013.01); *C08G 77/52* (2013.01); *C08G 77/70* (2013.01); *C08G 77/80* (2013.01); *C09J 163/00* (2013.01); *C09J 183/10* (2013.01); *H01L 21/6836* (2013.01); *B32B 2037/0092* (2013.01); *B32B 2037/1253* (2013.01); *B32B 2037/1269* (2013.01); *B32B 2038/0016* (2013.01); *B32B 2250/03* (2013.01); *B32B 2250/04* (2013.01); *B32B 2250/05* (2013.01); *B32B 2270/00* (2013.01); *B32B 2307/40* (2013.01); *B32B 2307/412* (2013.01); *B32B 2307/414* (2013.01); *B32B 2457/00* (2013.01); *B32B 2457/08* (2013.01); *B32B 2457/12* (2013.01); *B32B 2457/14* (2013.01); *H01L 2221/68381* (2013.01); *H01L 2221/68386* (2013.01)

(56) References Cited

U.S. PATENT DOCUMENTS

| | | |
|---|---|---|
| 8,965,295 B2 | 2/2015 | Cendrillon et al. |
| 9,054,765 B2 | 6/2015 | Cendrillon et al. |
| 2003/0064305 A1 | 4/2003 | Ono et al. |
| 2007/0191552 A1 | 8/2007 | Ichiroku et al. |

FOREIGN PATENT DOCUMENTS

| | | |
|---|---|---|
| EP | 3000596 A1 | 3/2016 |
| EP | 3174091 A1 | 5/2017 |
| EP | 3255662 A1 | 12/2017 |
| JP | 2003-177528 A | 6/2003 |
| JP | 2014-534721 A | 12/2014 |
| WO | 2015/072418 A1 | 5/2015 |

* cited by examiner

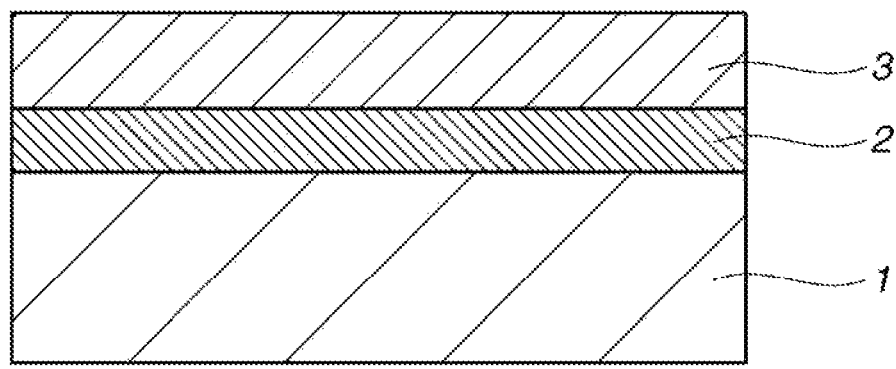

WAFER LAMINATE, METHOD FOR PRODUCTION THEREOF, AND ADHESIVE COMPOSITION FOR WAFER LAMINATE

CROSS-REFERENCE TO RELATED APPLICATION

This non-provisional application claims priority under 35 U.S.C. § 119(a) on Patent Application No. 2016-199829 filed in Japan on Oct. 11, 2016, the entire contents of which are hereby incorporated by reference.

TECHNICAL FIELD

The present invention relates to a wafer laminate which will find use in the field of semiconductors, a method for producing the wafer laminate, and an adhesive composition to be used for production of the wafer laminate.

BACKGROUND ART

Three-dimensional semiconductor mounting has come to be indispensable to realization of further enhance density and capacity. The three-dimensional mounting technology is a semiconductor production technology in which semiconductor chips are each thinned and they are stacked to form a multilayer structure while interconnecting them by silicon through electrodes (through silicon via (TSV)). To realize this, it is necessary to thin the substrate formed with a semiconductor circuit by grinding the non-circuit-formation surface (also called the "back side") thereof, and to form electrodes inclusive of the TSV on the back side. Conventionally, in performing the back side grinding of a silicon substrate, a protective tape is adhered to the surface opposite to the surface to be ground, thereby to prevent the wafer from breaking during grinding. However, the protective tape uses an organic resin film as a support base material, and is insufficient in strength and heat resistance though flexible, so that the tape is unsuited to formation of the TSV or formation of a wiring layer on the back side.

Here, there has been proposed a new system which withstands the steps of grinding the back side and forming electrodes on the back side, the system involving the bonding of the semiconductor substrate to a support (of silicon, glass, or the like) with the help of an adhesive. What is most important in this new system is the adhesive to bond together the substrate and the support. This adhesive should be able to bond the substrate to the support completely without gaps remaining therein and also able to withstand this bonding step. Moreover, the adhesive should be able to permit the thin wafer to peel off easily from the support. Incidentally, the resulting adhesion layer is referred to as "temporary adhesion layer (or temporary adhesive layer)" hereinafter since it is peeled off eventually as mentioned above.

According to a known existing technology for the temporary adhesion layer and the method of its peeling, the adhesive is made from a thermofusible hydrocarbon compound and the bonding and peeling are performed while it is in a molten state with heating (see Patent Document 1, JP-A 2003-177528). Although this technology is simple and easy because it is controlled with heating alone, it becomes unstable at high temperatures above 200° C. This disadvantage limits its applications.

There has also been proposed a technology which employs a silicone pressure-sensitive adhesive for the temporary adhesive layer (see Patent Document 2, WO 2015/072418). This technology is intended to bond the substrate to the support with a silicone pressure-sensitive adhesive of addition curing type and to peel them apart by dipping them in chemicals capable of dissolving or decomposing the silicone resin. Since peeling in this way takes a very long time, it cannot be applied easily to the process for actual production.

There has been proposed another technology for peeling the adhesive layer from the support by decomposing the adhesive layer with the help of high-intensity light irradiated to the adhesive containing a light-absorbing substance (see Patent Document 3, JP-A 2013-534721). This technology has the advantage of being able to reduce the time required for treating each substrate at the time of separating the substrate from the support; however, it also has the disadvantage that the support has to be made of a metal compound for effective conversion of irradiated light into heat. The metal support is liable to cause metal contamination to the substrate.

CITATION LIST

Patent Document 1: JP-A 2003-177528
Patent Document 2: WO 2015/072418
Patent Document 3: JP-A 2013-534721

DISCLOSURE OF INVENTION

It is an object of the present invention to provide a wafer laminate suitable for production of thin wafers, a method for producing the wafer laminate, and an adhesive composition for wafer laminate which is used for the production of the wafer laminate. The present invention offers the following advantages. Ability to easily bond a wafer to a support. Ability to form a film of uniform thickness on a substrate with noticeable steps. Suitability to the steps of forming TSV and wiring on the wafer back side. High resistance to the thermal process such as CVD (chemical vapor deposition) which the wafer undergoes. Ease with which the wafer is peeled off from the support. Improved productivity for thin wafers.

As the result of extensive investigations to achieve the above-mentioned object, the present inventors found that the object is achieved with a wafer laminate which is obtained by bonding a wafer to a support with a specific adhesive layer interposed between them.

Accordingly, the present invention provides a wafer laminate, a method for producing the wafer laminate, and an adhesive compound for the wafer laminate as defined in the following.

1. A wafer laminate which includes a support, an adhesive layer formed on the support, and a wafer which is laminated on the adhesive layer in such a way that that surface of the wafer which has the circuit surface faces toward the adhesive layer, wherein the adhesive layer is a cured product of an adhesive composition containing resin A and resin B, the resin A containing repeating units represented by the following formula (1) and having a weight-average molecular weight of 500 to 500,000, and the resin B containing a siloxane skeleton:

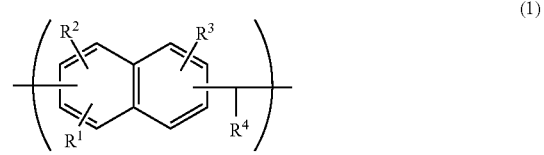

(1)

wherein $R^1$ to $R^3$ are independently a hydrogen atom, a hydroxyl group, and a monovalent organic group having 1 to 20 carbon atoms, with at least one of $R^1$ to $R^3$ being a hydroxyl group, and $R^4$ is a hydrogen atom or a monovalent organic group having 1 to 30 carbon atoms, which may have a substituent.

2. The wafer laminate as defined in paragraph 1 above, in which the adhesive layer has a transmittance up to 20% for light having a wavelength of 355 nm.

3. The wafer laminate as defined in paragraph 1 or 2 above, in which the resin B is a phenol-modified silicone resin which includes the repeating units represented by the formula (2) below, and optionally the repeating units represented by the formula (3) below, and has a weight-average molecular weight of 3,000 to 500,000:

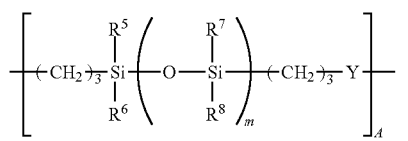
(2)

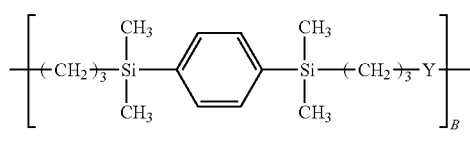
(3)

wherein $R^5$ to $R^8$ are independently a monovalent hydrocarbon group having 1 to 8 carbon atoms; m is an integer of 1 to 100; A and B are positive numbers which satisfy $0<A\le1$, $0\le B<1$, and $A+B=1$; Y is a divalent organic group represented by the formula (4) below;

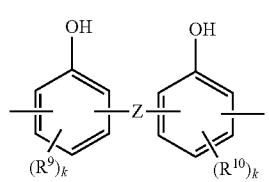
(4)

wherein Z is a single bond or a divalent organic group selected from the following formulas,

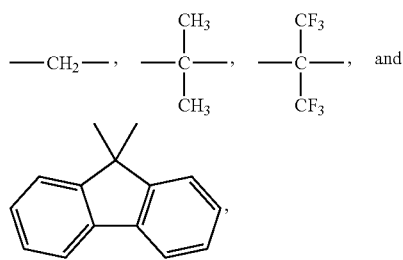

$R^9$ and $R^{10}$ are independently a linear, branched, or cyclic alkyl group having 1 to 4 carbon atoms, or a linear, branched, or cyclic alkoxyl group; and k is 0, 1, or 2.

4. The wafer laminate as defined in any one of paragraphs 1 to 3 above, in which the adhesive composition further contains a crosslinking agent.

5. The wafer laminate as defined in any one of paragraphs 1 to 4 above, in which the adhesive composition further contains an organic solvent.

6. A method for producing the wafer laminate defined in any one of paragraphs 1 to 5 above, the method including:
   (a) a step of forming an adhesive layer directly on a support,
   (b) a step of bonding under reduced pressure the adhesive layer to that surface of a wafer on which is formed the circuit, and
   (c) a step of causing the layer of adhesive composition to undergo heat curing, thereby forming an adhesive layer.

7. A method for producing a thin wafer which includes a step of grinding or polishing the wafer laminate obtained by the method defined in paragraph 6 above, the grinding or polishing being performed on that side of the wafer on which no circuit is formed.

8. An adhesive composition which includes a resin containing repeating units represented by the formula (1) below and having a weight-average molecular weight of 500 to 500,000, and a resin containing a siloxane skeleton:

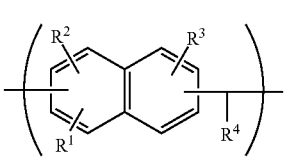
(1)

wherein $R^1$ to $R^3$ are independently a hydrogen atom, a hydroxyl group, and a monovalent organic group having 1 to 20 carbon atoms, with at least one of $R^1$ to $R^3$ being a hydroxyl group, and $R^4$ is a hydrogen atom or a monovalent organic group having 1 to 30 carbon atoms, which may have a substituent.

Advantageous Effects of the Invention

The present invention provides a wafer laminate which includes a wafer and a support firmly bonding together, has good heat resistance, and peels apart easily.

BRIEF DESCRIPTION OF THE DRAWING

FIG. 1 is a schematic diagram depicting one example of the wafer laminate according to the present invention.

DESCRIPTION OF THE PREFERRED EMBODIMENTS

Wafer Laminate

The wafer laminate according to the present invention is included of a support, an adhesive layer formed on the support, and a wafer which is laminated on the adhesive layer in such a way that that surface of the wafer which has the circuit surface faces toward the adhesive layer. As mentioned in more detail below, the wafer laminate according to the present invention is included of a support 1, an adhesive layer 2, and a wafer 3 which are arranged as depicted in FIG. 1.

Support

The support mentioned above may be a transparent substrate, silicon wafer, ceramic substrate, and the like. A transparent substrate is desirable because of its ability to pass a laser beam emitted to peel off the support. Examples of the transparent substrate include a glass substrate and a quartz substrate. The support may have a thickness of 300 to 1,000 μm, preferably 500 to 800 μm.

Wafer

The wafer mentioned above may usually be a semiconductor wafer, which includes, for example, silicon wafer, germanium wafer, gallium-arsenic wafer, gallium-phosphorus wafer, and gallium-arsenic-aluminum wafer. These wafers are not specifically restricted in thickness; their ordinary thickness is 600 to 800 μm, preferably 625 to 775 μm.

Adhesive Layer

The adhesive layer (temporary adhesive layer) is obtained by curing an adhesive composition composed of resin A and resin B. Resin A contains the repeating units represented by the formula (1) and resin B contains the siloxane skeleton. The repeating units represented by the formula (1) may be included of only one species or at least two species.

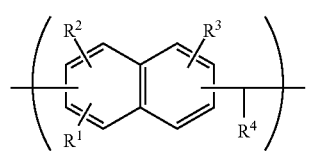
(1)

In the formula (1), $R^1$ to $R^3$ are independently a hydrogen atom, hydroxyl group, or a monovalent organic group having 1 to 20, preferably 1 to 10 carbon atoms, with at least one of $R^1$ to $R^3$ being a hydroxyl group.

The monovalent organic group mentioned above includes, for example, a linear, branched, or cyclic alkyl groups having 1 to 20 carbon atoms such as methyl group, ethyl group, n-propyl group, isopropyl group, n-butyl group, sec-butyl group, tert-butyl group, n-pentyl group, neopentyl group, n-hexyl group, n-heptyl group, n-octyl group, n-nonyl group, n-decyl group, n-dodecyl group, n-pentadecyl group, n-icosyl group, cyclopentyl group, cyclohexyl group, cyclopentylmethyl group, cyclohexylmethyl group, cyclopentylethyl group, cyclohexylethyl group, cyclopentylbutyl group, cyclohexylbutyl group, and admantyl group; a linear, branched, or cyclic alkoxyl group having 1 to 15 carbon atoms such as methoxy group; an epoxy group-containing such group as glycidyloxy group; and an aryl group such as phenyl group and naphthyl group. $R^1$ to $R^3$ preferably include, for example, a hydrogen atom, hydroxy group, and methyl group.

In the formula (1), $R^4$ is a hydrogen atom or a monovalent organic group having 1 to 30, preferably 1 to 10 carbon atoms with an optional substituent. The monovalent organic group represented by $R^4$ includes, for example, an alkyl group, phenyl group, naphthyl group, anthracenyl group, and norbornyl group, with part of the hydrogen atoms being optionally substituted by an alkyl group, aryl group, aldehyde group, halogen atom, nitro group, nitrile group, or hydroxyl group.

Resin A is usually obtained by allowing naphthol (or a derivative thereof) and an aldehyde compound to undergo polycondensation reaction with the help of an acid or base catalyst in a solvent or without solvent at room temperature or with cooling or heating according to need.

The naphthol or derivatives thereof mentioned above include, for example, 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl)naphthalene, 6-(4-hydroxyphenyl)-2-naphthol, 6-(cyclohexyl)-2-naphthol, 1,1'-bi-2-naphthol, 6,6'-bi-2-naphthol, 9,9-bis(6-hydroxy-2-naphthyl)fluorene, 6-hydroxy-2-vinylnaphthalene, 1-hydroxymethylnaphthalene, and 2-hydroxymethylnaphthelene. The naphthol or derivatives thereof may be used alone or in combination with one another.

The aldehyde compounds mentioned above include, for example, those which are represented by the formula (5) below.

$$R^4\text{—CHO} \quad (5)$$

wherein $R^4$ is defined as above.

The aldehyde compounds represented by the formula (5) include, for example, formaldehyde, trioxane, paraformaldehyde, acetaldehyde, propylaldehyde, adamantine carboaldehyde, benzaldehyde, phenylacetaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthylaldehyde, 2-naphthylaldehyde, anthrathenecarboaldehyde, pyrenecarboaldehyde, furfural, methylal, phthalaldehyde, isophthalaldehyde, terephthalaldehyde, naphthalenedicarboaldehyde, anthrathenedicarboaldehyde, and pyrenedicarboaldehyde. The aldehyde compounds may be used alone or in combination with one another.

The solvent to be used for the polycondensation reaction mentioned above includes, for example, alcohols such as methanol, ethanol, isopropyl alcohol, butanol, ethylene glycol, propylene glycol, diethylene glycol, glycerol, methylcellosolve, ethylcellosolve, butylcellosolve, and propyleneglycol monomethyl ether, ethers such as diethyl ether, dibutyl ether, diethylene glycol diethyl ether, diethylene glycol dimethyl ether, tetrahydrofuran (THF), and 1,4-dioxane; chlorine-containing solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethylmethylketone, and isobutylmethyl ketone; esters such as ethyl acetate, n-butyl acetate, and propylene glycol methyl ether acetate; lactones such as γ-butyrolactone; and aprotonic polar solvent such as dimethylsulfoxide, N,N-dimethylformamide, and hexamethylphosphoric triamide. These solvents may be used alone or in combination with one another. Moreover, the solvent should be used in an amount of 0 to 2,000 parts by weight (preferably 10 to 2,000 parts by weight) per 100 parts by weight of the total amount of the naphthol (or a derivative thereof) and the aldehyde compound.

The acid catalyst used for the polycondensation reaction mentioned above includes, for example, inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium (IV) methoxide, titanium (IV) ethoxide, titanium (IV) isopropoxide, and titanium (IV) oxide.

The base catalyst used for the polycondensation reaction mentioned above includes, for example, inorganic base such as sodium hydroxide, potassium hydroxide, barium hydroxide, sodium carbonate, sodium hydrogen carbonate, potassium carbonate, lithium hydride, sodium hydride, potassium hydride, and calcium hydride; alkyl metal such as methyl lithium, n-butyl lithium, methyl magnesium chloride, and ethyl magnesium bromide; alkoxide such as sodium methoxide, sodium ethoxide, and potassium tert-butoxide; and organic base such as triethylamine, diisopropylethylamine, N,N-dimethylaniline, pyridine, and 4-dimethylaminopyridine.

The catalyst should be used in an amount of 0.001 to 100 parts by weight (preferably 0.005 to 50 parts by weight) per 100 parts by weight of the total amount of the naphthol (or a derivative thereof) and the aldehyde compound. The reaction temperature ranges from −50° C. to the boiling point of the solvent (preferably from room temperature to 100° C.).

The polycondensation reaction may be accomplished by charging the reactor with the naphthol (or a derivative thereof), the aldehyde, and the catalyst all at once, or by adding dropwise the naphthol (or a derivative thereof) and the aldehyde to the reactor in the presence of the catalyst.

The naphthol (or a derivative thereof) and the aldehyde compound should be used in such an amount that the molar ratio of the latter to the former is 0.01 to 5, preferably 0.05 to 2, more preferably 0.05 to 1, and most desirably 0.1 to 0.9.

After the polycondensation reaction is complete, the reactor is cleaned of the raw materials and catalyst remaining unreacted. This cleaning is accomplished by heating up to 130° C. to 230° C. under reduced pressure (eg. 1 to 50 mmHg) adequate for removal of volatile components. The foregoing steps may be replaced by the fractionation of the resulting polymer (which is achieved by adding water or adequate solvent) or by the reprecipitation of the resulting polymer (which is achieved by dissolving the polymer in a good solvent). An adequate method should be selected according to the properties of the reaction product.

Resin A should have a weight-average molecular weight (Mw) of 500 to 500,000, preferably 1,000 to 100,000. The polymer mentioned above should preferably have a degree of dispersion ranging from 1.2 to 20. The polymer should be cleaned of monomer components, oligomer components, and low-molecular weight components (having an Mw lower than 500), so that it has a limited amount of volatile components which vaporize during baking. This protects the surrounding and surface of the baking cup from contamination and defects with condensates of volatile matter. Incidentally, the Mw in this invention is expressed in terms of the polystyrene conversion value measured by gel permeation chromatography (GPC) which employs THF as the solvent.

Resin B should preferably be a silicone resin from the standpoint of its use; that is, it is used to bond together a transparent substrate (such as glass) and a silicon wafer which are different from each other in nature. The most desirable example of resin B is a phenol-modified silicone resin which contains repeating units represented by the formula (2) below, and optionally repeating units represented by the formula (3) below.

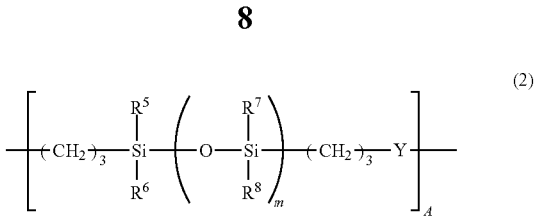

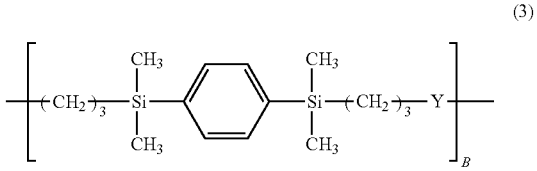

In the formulas (2) and (3), $R^5$ to $R^8$ are independently a monovalent hydrocarbon group having 1 to 8 carbon atoms; m is an integer of 1 to 100; A and B are positive numbers which satisfy $0<A\leq1$, $0\leq B<1$, and $A+B=1$; Y is a divalent organic group represented by the formula (4) below.

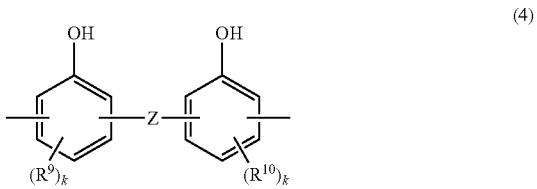

In the formula (4), Z is a single bond or a divalent organic group selected from the following formulas,

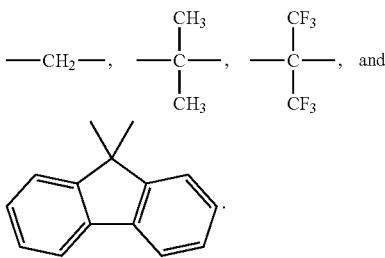

$R^9$ and $R^{10}$ are independently a linear, branched, or cyclic alkyl group having 1 to 4 carbon atoms, or a linear, branched, or cyclic alkoxyl group; and k is 0, 1, or 2.

The phenol-modified silicone resin should be one which has an Mw ranging from 3,000 to 500,000, preferably 10,000 to 100,000.

The phenol-modified silicone resin can be synthesized according to the method disclosed in JP-A 2013-110391.

The adhesive composition should contain resin B in an amount of 100 to 500 parts by weight (preferably 120 to 400 parts by weight, more preferably 150 to 300 parts by weight) per 100 parts by weight of resin A. The amount of resin B specified above is adequate for the coating film to be sound without cracking and to peel off easily from the support.

Also, resin B should contain siloxane units in an amount of 30 to 70 wt %. Moreover, the adhesive layer should contain the siloxane derived from resin B in an amount of preferably 20 to 50 wt %. This amount is satisfactory for the adhesive layer to shield light sufficiently and to provide good bonding between the support and the wafer.

The adhesive composition should preferably contain a crosslinking agent which brings about crosslinking through thermal reactions. The crosslinking agent includes, for example, epoxy compounds, epoxy resins, and amino resins (such as methylolmelamine), which have at least two functional groups in the molecule. Addition of a catalyst is desirable for the crosslinking agent to rapidly crosslink the polymer (mentioned above).

The epoxy compound or epoxy resin mentioned above includes difunctional, trifunctional, tetrafunctional, and polyfunctional ones. Some examples of them are listed below. EOCN-1020 (represented by the formula below), EOCN-102S, XD-1000, NC-2000-L, EPPN-201, GAN, NC6000 (available from Nippon Kayaku Co., Ltd.), and those represented by the following formulas.

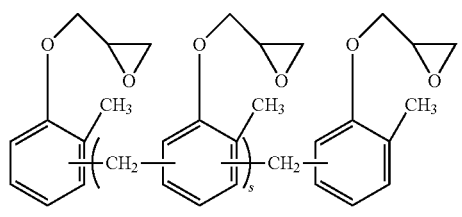

EOCN-1020
$s = 3$ to $6$

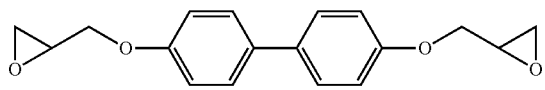

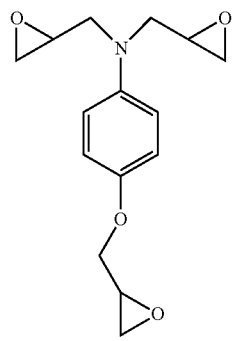

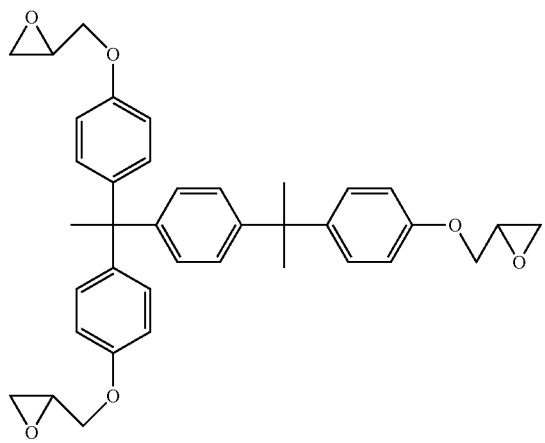

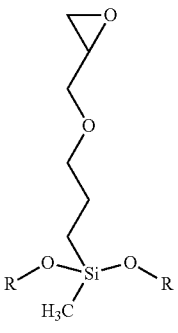

R = methyl or ethyl

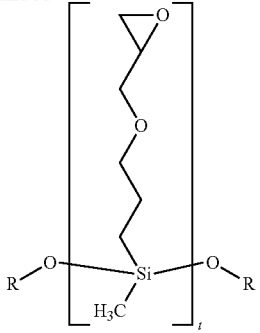

R = methyl or ethyl
$t = 1$  20 wt %
$t = 2$  75 wt %
$t \geq 3$  5 wt %

The foregoing epoxy compound or epoxy resin to be used as a crosslinking agent should be added in an amount of 0.1 to 50 parts by weight (preferably 0.1 to 30 parts by weight, and more preferably 1 to 30 parts by weight) per 100 parts by weight of resin A and resin B combined together. One or more than one crosslinking agent may be used. The crosslinking agent added in an amount specified above will provide a sufficient crosslink density and the resulting cured product functions satisfactorily.

In the case where the epoxy resin mentioned above is used as a crosslinking agent, it is desirable to add a cure accelerator which functions as a catalyst. The epoxy resin cure accelerator allows the curing reaction to proceed adequately and uniformly.

The epoxy resin cure accelerator includes, for example, imidazole compound such as 2-methylimidazole, 2-ethylimidazole, 2-ethyl-4-methylimidazole, ethylcyanate compound thereof, 2-phenylimidazole, 2-phenyl-4-methylimidazole, 2-phenyl-4-methyl-5-hydroxymethylimidazole, and 2-phenyl-4,5-dihydroxymethylimidazole; DBU compound such as 1,8-diazabicyclo[5.4.0]undecene-7 (DBU), 1,5-diazabicyclo[4.3.0]nonene-5 (DBN), organic acid salt of DBU, phenolic resin salt of DBU, and tetraphenylborate salt of DBU derivative; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphneylborate, and tetraphenylphosphine.tetraphenylborate; quaternary phosphonium salt; tertiary amine (such as triethylene ammonium-triphenyl borate); and tetraphenyl boric acid salt thereof. The epoxy resin cure accelerators may be used alone or in combination with two or more.

The epoxy resin cure accelerator should be added in an amount of 0.1 to 10 parts by weight (preferably 0.2 to 5 parts by weight) per 100 parts by weight of the total amount of resin A and resin B.

The amino resin (such as methylolmelamine) to be used in the present invention includes at least one kind of compound selected from the group including of an amino condensate modified with formalin or formalin-alcohol and a phenol compound having at least two (on average) methylol group or alkoxymethylol group in one molecule.

The amino resin should be one which has an Mw ranging from 150 to 10,000 (preferably 200 to 3,000). The amino resin which has an Mw as specified above causes the adhesive composition to cure satisfactorily and to give a cured product with good heat resistance.

The amino compound modified with formalin or formalin-alcohol includes, for example, a melamine condensate modified with formalin or formalin-alcohol and a urea condensate modified with formalin or formalin-alcohol.

The formalin or formalin-alcohol-modified melamine condensate mentioned above may be prepared by any known method, such as the one including of converting melamine monomer into methylol with formalin (or optionally further converting into alkoxyl with alcohol). The resulting modified melamine is represented by the formula below. Incidentally, the alcohol just mentioned above should preferably be a lower alcohol, such as alcohols having 1 to 4 carbon atoms.

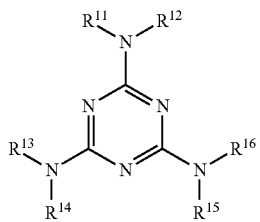

In the above formula, $R^{11}$ to $R^{16}$ are independently a methylol group, alkoxymethyl group containing a linear, branched, or cyclic alkoxyl group having 1 to 4 carbon atoms, or hydrogen atom, with at least one of them being a methylol group or alkoxymethyl group.

The foregoing modified melamine includes, for example, trimethoxymethylmonomethylolmelamine, dimethoxymethylmonomethylolmelamine, trimthylolmelamine, hexamethylolmelamine, and hexamethoxymethylolmelamine. The modified melamine or oligomers (such as dimer and trimer) obtained therefrom is reacted with formaldehyde in the usual way for polycondensation so that the resulting reaction product has a desired molecular weight. Thus, there is obtained the melamine condensate which is modified with formalin or formalin-alcohol. Incidentally, at least one of the modified melamine or condensate thereof may be used as a crosslinking agent.

The urea condensate modified with formalin or formalin-alcohol may be prepared in the known way by converting a urea condensate (of desirable molecular weight) into methylol by modification with formalin and further alkoxylating the resulting methylol by modification with alcohol.

Examples of the modified urea condensate include methoxymethylated urea condensate, ethoxymethylated urea condensate, and propoxymethylated urea condensate. At least one of them may be used.

Examples of the phenol compound having at least two methylol groups or alkoxymethylol groups on average in one molecule include (2-hydroxy-5-methyl)-1,3-benzenedimethanol and 2,2',6,6'-tetramethoxymethylbisphenol A.

The amino condensates or phenol compounds mentioned above may be used alone or in combination with one another.

The crosslinking agent may be used in an amount of 0.1 to 50 parts by weight, preferably 1 to 30 parts by weight, per 100 parts by weight of the total amount of resin A and resin B. These amounts are sufficient for the adhesive compound to completely cure into a hardened product that functions perfectly.

The amino resin such as methylolmelamine should preferably be used as a crosslinking agent in combination with a thermal acid generator as a catalyst. Examples of this thermal acid generator are not specifically restricted; a typical example is an ammonium salt represented by the following formula.

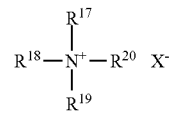

In the formula above, $R^{17}$ to $R^{20}$ are independently a hydrogen atom; a linear, branched, or cyclic alkyl group or oxoalkyl group having 1 to 12 carbon atoms; a linear, branched, or cyclic alkenyl group or oxoalkenyl group having 2 to 12 carbon atoms; an aryl group having 6 to 20 carbon atoms; or an aralkyl group or aryloxoalkyl group having 7 to 12 carbon atoms; which may have the hydrogen atoms therein substituted partly or entirely with alkoxyl groups. Two selected from $R^{17}$ to $R^{20}$ may form a ring with nitrogen atoms connected thereto; the ring may be an aliphatic ring having the nitrogen atom in the ring having 3 to 10 carbon atoms, or a complex aromatic ring having the nitrogen atom in the ring having 5 to 10 carbon atoms. $X^-$ is any of sulfonic acid in which at least one $\alpha$-position is fluorinated, or perfluoroalkylimide acid or perfluoroalkylmethide acid.

Examples of $X^-$ include a perfluoroalkanesulfonic acid anion (such as triflate anion and nonaflate anion); sulfonate anion in which at least one of $\alpha$-position is fluoro-substituted; imide anion (such as bis(trifluoromethylsulfonyl)imide anion, bis(perfluoroethylsulfonyl)imide anion, and bis(perfluorobutylsulfonyl)imide anion; and metanide anion (such as tris(trifluoromethylsulfonyl)metanide anion and tris(perfluoroethylsulfonyl)metanide anion).

The thermal acid generator should be added in an amount of 0.1 to 15 parts by weight, preferably 0.2 to 10 parts by weight, per 100 parts by weight of resin A and resin B combined together. These amounts are sufficient for the adhesive compound to completely cure and to have good storage stability.

The adhesive composition mentioned above may optionally contain any solvent, whose examples include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether, and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylenen glycol mono-tert-butyl ether acetate, and γ-butyrolactone. These solvents may be used alone or in combination with two or more. The solvent may be used in an amount of 100 to 5,000 parts by weight, preferably 150 to 2,500 parts by weight, per 100 parts by weight of resin A and resin B combined together.

Incidentally, the adhesive composition may be used in the form of film free of solvent.

The adhesive composition mentioned above may optionally contain a surface active agent and an antioxidant for improvement in heat resistance.

Examples of the surface active agent include, but are not limited to, polyoxyethylene alkyl ethers such as polyoxyethylene lauryl ether, polyoxyethylene stearyl ether, polyoxyethylene cetyl ether, and polyoxyethylene olein ether, polyoxyethylene alkylaryl ethers such as polyoxyethylene octylphenol ether, and polyoxyethylene nonylphenol ether, polyoxyethylene-polyoxypropylene block copolymers; sorbitan fatty acid esters such as sorbitan monolaurate, sorbitan monoparmitate, and sorbitan monostearate; polyoxyethylene sorbitan trioleate fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate which are nonionic surface active agents of polyoxyethylene sorbitan fatty acid ester; fluorine-based surface active agents such as Eflop® (EF301, EF303, and EF352, from Tohkem Products Corporation), Megaface® (F171, F172, and F173, from DIC Corporation), Fluorad® (FC430 and FC431, from 3M Japan Limited), Asahi Guard AG710, Surflon® S-381, S-382, SC101, SC102, SC103, SC104, SC105, and SC106), Surfynol® E1004, KH-10, KH-20, KH-30, and KH-40, from Asahi Glass Co., Ltd; organosiloxane polymer KP341, X-70-092, X-70-093, and X-70-1102, from Shin-Etsu Chemical Co., Ltd; and acrylic acid-based or methacrylic acid-based Polyflow No. 75 and No. 95 (from Kyoei Kagaku Kogyo). These surface active agents may be used alone or in combination with one another.

The antioxidant should preferably be at least one species selected from hindered phenol compounds, hindered amine compounds, organophosphorus compounds, and organic sulfur compounds.

Preferred examples of the hindered phenol compounds include, but are not limited to, 1,3,5-trimethyl-2,4,6-tris(3, 5-di-tert-butyl-4-hydroxybenzyl)benzene (TM: IRGANOX 1330), 2,6-di-tert-butyl-4-methylphenol (TM: Sumilizer GHT), 2,5-di-tert-butyl-hydroquinone (TM: Nocrac NS-7), 2,6-di-tert-butyl-4-ethylphenol (TM: Nocrac M-17), 2,5-di-tert-amylhydroquinone (TM: Nocrac DAH), 2,2'-methylenebis(4-methyl-6-tert-butylphenol) (TM: Nocrac NS-6), 3,5-di-tert-butyl-4-hydroxy-benzylphosphonate-diethyl ester (TM: IRGANOX 1222), 4,4'-thiobis(3-methyl-6-tert-butyl-phenol) (TM: Nocrac 300), 2,2'-methylenebis(4-ethyl-6-tert-butylphenol) (TM: Nocrac NS-5), 4,4-butylidenebis(3-methyl-6-tert-butylphenol) (TM: Adkstab A0-40), 2-tert-butyl-6-(3-tert-buyl-2-hydroxy-5-methylbenzyl)-4-methylphenyl acrylate (TM: Sumilizer 6M), 2-[1-(2-hydroxy-3,5-di-tert-pentylpheny)ethyl]-4,6-di-tert-pentylphenyl acrylate (TM: Sumilizer GS), 2,2'-methylenebis[4-methyl-6-(α-methyl-cyclohexyl)phenol], 4,4'-methylenebis(2,6-di-tert-butylphenol) (TM: Seenox 226M), 4,6-bis(octylthiomethyl)-o-cresol (TM: IRGANOX 1520L), 2,2'-ethylenebis(4,6-di-tert-butylphenol), octadecyl-3-(3,5-di-tert-butyl-4-hydroxyphenyl)propionate (TM: IRGANOX 1076), 1,1,3-tris-(2-methyl-4-hydroxy-5-tert-butylphenyl)butane (TM: Adkstab A0-30), tetrakis[methylene-(3,5-di-tert-butyl-4-hydroxyhydrocinnamate)]methane (TM: Adkstab A0-60), triethyleneglycolbis[3-(3-tert-butyl-5-methyl-4-hydroxyphenyl)propionate] (TM: IRGANOX 245), 2,4-bis(n-octylthio)-6-(4-hydroxy-3,5-di-tert-butylanilino)-1,3,5-triazine (TM: IRGANOX 565), N,N'-hexamethylenebis(3,5-di-tert-butyl-4-hydroxy-hydroxycinnamide) (TM: IRGANOX 1098), 1,6-hexanediol-bis[3-(3,5-di-tert-butyl-4-hydroxyphenyl)propionate] (TM: IRGANOX 259), 2,2-thio-diethylenebis[3-(3,5-di-tert-butyl-4-hydroxyphenyl)propionate](TM: IRGANOX 1035), 3,9-bis[2-[3-(3-tert-butyl-4-hydroxy-5-methylphenyl)propionyl-oxy]1,1-dimethylethyl]2,4,8,10-tetraoxaspiro[5.5]undecane (TM: Sumilizer GA-80), tris-(3,5-di-tert-butyl-4-hydroxybenzyl) isocyanurate (TM: IRGANOX 3114), bis(3,5-di-tert-butyl-4-hydroxybenzylsulfonic acid ethyl)calcium/polyethylene wax mixture (50:50) (TM: IRGANOX 1425WL), isooctyl-3-(3,5-di-tert-butyl-4-hydroxyphenyl)propionate (TM: IRGANOX 1135), 4,4'-thiobis(6-tert-butyl-3-methylphenol) (TM: Sumilizer WX-R), and 6-[3-(3-tert-butyl-4-hydroxy-5-methylphenyl)propoxy]-2,4,8,10-tetra-tert-butylbenz-[d, f][1,3,2]dioxaphosphepin (TM: Sumilizer GP).

Preferred examples of the hindered amine compounds include, but are not limited to, p,p'-dioctyldiphenylamine (TM: IRGANOX 5057), phenyl-α-naphthylamine (TM: Nocrac PA), poly(2,2,4-trimehyl-1,2-dihydroquinoline) (TM: Nocrac 224, 224-S), 6-ethoxy-2,2,4-trimethyl-1,2-dihydroquinoline (TM: Nocrac AW), N,N'-diphenyl-p-phenylenediamine (TM: Mocrac DP), N,N'-di-β-naphthyl-p-phenylenediamine (TM: Nocrac white), N-phenyl-N'-isopropyl-p-phenylenediamine (TM: Nocrac 810NA), N,N'-diallyl-p-phenylenediamine (TM: Nonflex TP), 4,4'-(α,α'-dimethylbenzyl)diphenylamine (TM: Nocrac CD), p,p-toluenesulfonylaminodiphenylamine (TM: Nocrac TD), N-phenyl-N'-(3-methacryloxy-2-hydroxypropyl)-p-phenylenediamine (TM: Nocrac G1), N-(1-methylheptyl)-N'-phenyl-p-phenylenediamine (TM: Ozonon 35), N,N'-di-sec-butyl-p-phenylenediamine (TM: Sumilizer BPA), N-phenyl-N'-1,3-dimethylbutyl-p-phenylenediamine (TM: Antigene 6C), alkylated diphenylamine (TM: Sumilizer 9A), dimethyl succinate-1-(2-hydroxyethyl)-4-hydroxy-2,2,6,6-tetamethyl-piperidine polycondensate (TM: Tinuvin 622LD), poly[[6-(1,1,3,3-tetramethylbutyl)amino-1,3,5-triazine-2,4-dyl][(2,2,6,6-tetramethyl-4-piperidyl)imino]hexamethylene [(2,2,6,6-tetramethyl-4-piperidyl)imino]] (TM: CHIMASSORB 944), N,N'-bis(3-aminopropyl)-ethylenediamine-2,4-bis[N-butyl-N-(1,2,2,6,6-pentamethyl-4-piperidyl)amino]-6-chloro-1,3-5-triazine condensate (TM: CHIMASSORB 119FL), bis(1-octyloxy-2,2,6,6-tetramethyl-4-piperidyl)sebacate (TM: TINUVIN 123), bis(2,2,6,6-tetramethyl-4-piperidyl)sebacate (TINUVIN 770), 2-(3,5-di-tert-butyl-4-hydroxybenzyl)-2-n-butylmalonic acid bis(1,2,2,6,6-pentamethyl-4-piperidyl) (TM: TINUVIN 144), bis(1,2,2,6, 6-pentamethyl-4-piperidyl)1,2,3,4-butanetetracarboxylate (TM: LA-57), tetrakis(2,2,6,6-tetramethyl-4-piperidyl)1,2, 3,4-butanetetracarboxylate (TM: LA-52), mixture of ester compounds composed of 1,2,3,4-butanetetracarboxylic acid and 1,2,2,6,6-pentamethyl-4-piperidinol and 1-tridecanol (TM: LA-62), mixture of ester compounds composed of 1,2,3,4-butanetetracarboxylic acid and 2,2,6,6-tetramethyl-4-piperidinol and 1-tridecanol (TM: LA-67), mixture of ester compounds composed of 1,2,3,4-butanetetracarboxylic acid and 1,2,2,6,6-pentamethyl-4-piperidinol and 3,9-bis(2-hydroxy-1,1-dimethylethyl)-2,4,8,10-tetraoxaspiro[5.5]undecane (TM: LA-63P), mixture of ester compounds composed of 1,2,3,4-butanetetracarboxylic acid and 2,2,6,6-tetramethyl-4-piperidinol and 3,9-bis(2-hydroxy-1,1-dimethylethyl)-2,4,8,10-tetraoxaspiro[5.5]undecane (TM: LA-68LD), (2,2,6,6-tetramethyleneo-4-piperidyl)-2-propylenecarboxylate (TM: Adkstab LA-82), and (1,2,2,6,6-pentamethyl-4-piperidyl)-2-propylenecrboxylate (TM: Adkstab LA-87).

Examples of the organophosphorus compounds include, but are not limited to, bis(2,4-di-tert-butylphenyl)[1,1-biphenyl]-4,4'-diylbisphosphite, 9,10-dihydro-9-oxa-10-phosphaphenanthrene-10-oxide (TM: SANKO-HCA), trimethyl phosphite (TM: JP302), tri-n-butyl phosphite (TM: JP304), tripheny phosphite (TM: Adkstab TPP), diphenylmonooctyl phosphite (TM: Adkstab C), tri(p-cresyl) phosphite (TM: Chelex-PC), diphneylmonodecyl phosphite (TM: Adkstab 135A), diphenylmono(tridecyl) phosphite (TM: JPM313), tris(2-ethylhexyl) phosphite (TM: JP308), phenyldecyl phosphite (TM: Adkstab 517), tridecyl phosphite (TM: Adkstab 3010), tetraphneyldipropyleneglcol diphosphite (TM: JPP100), bis(2,4-di-tert-butylphenyl)pentaerythritol diphosphite (TM: Adkstab PEP-24G), tris(tridecyl) phosphite (TM: JP338E), bis(nonylphenyl)pentaerythritol diphosphite (TM: Adkstab PEP-4C), bis(2,6-di-tert-butyl-4-methylphenyl)pentaerythritol diphosphite (TM: Adkstab PEP-36), bis[2,4-di(1-phenylisopropyl)phenyl]pentaerythritol diphosphite (TM: Adkstab PEP-45), trilauryltrithio phosphite (TM: JPS312), tris(2,4-di-tert-butylphenyl) phosphite (TM: IRGAFOS 168), tris(nonylphenyl) phosphite (TM: Adkstab 1178), distearylpentaerythritol diphosphite (TM: Adkstab PEP-8), tris(mono, dinonylphenyl) phosphite (TM: Adkstab 239K), trioleyl phosphite (TM: Chelex-0L), tristearyl phosphite (TM: JP318E), 4,4'-buylidenebis(3-methyl-6-tert-butylphenyltridecyl) phosphite (TM: JPH1200), tetra(mixed alkyl having 12 to 15 carbon atoms)-4,4'-isopropylidenediphenyl diphosphite (TM: Adkstab 1500), tetra(tridecyl)-4,4'-butylidenebis(3-methyl-6-tert-butylphenol) diphosphite (TM: Adkstab 260), hexa(tridecyl)-1,1,3-tris(2-methyl-5-tert-butyl-4-hydroxyphenyl)butane triphosphtie (TM: Adkstab 522A), hydrogenated bisphenol A phosphite polymer (HBP), tetrakis(2,4-di-tert-butylphenyloxy)4,4-biphenylene-di-phosphine (TM: P-EPQ), tetrakis(2,4-di-tert-butyl-5-methylphenyloxy)4,4-biphenylene diphosphine (TM: GSY-101P), 2-[[2,4,8,10-tetrakis(1,1-dimethylethyl)benzo[d,f][1,3,2]dioxaphosphepin-6-yl]oxy]-N,N-bis[2-[[2,4,8,10-tetrakis(1,1-dimethylethyl)benzo[d,f][1,3,2]dioxaphospin-6-yl]oxy]ethyl]-ethanamin (TM: IRGAFOS 12), and 2,2'-methylenebis(4,6-di-tert-butylphenyl)octyl phosphite (TM: Adkstab HP-10).

Examples of the foregoing organosulfur compounds include, but are not limited to, dilauryl-3,3-thiodipropionate (TM: Sumilizer TPL-R), dimyristyl-3,3-thiodipropionate (TM: Sumilizer TPM), distearyl-3,3'-thiodipropionate (TM: Sumilizer TPS), pentaerythritol-tetrakis(3-laurylthiopropionate) (TM: Sumilizer TP-D), ditridecyl-3,3'-thiodipropionate (TM: Sumilizer TL), 2-mercaptobenzimiazol (TM: Sumilizer MB), ditridecyl-3,3'-thiodipropionate(TM: Adkstab A0-503A), 1,3,5-tri-β-stearylthiopropionyloxyethylisocyanurate, 3,3'-thiobispropionic acid didodecyl ester (TM: IRGANOX PS 800FL), and 3,3'-thiobispropionic acid dioctadecyl ester (TM: IRGANOX PS 802FL).

Preferable among the foregoing antioxidants is tetrakis[methylene-(3,5-di-tert-butyl-4-hydroxyhydrocinnamate)]methane. The foregoing antioxidants should be used in an amount of 0.5 to 5 parts by weight, preferably 1 to 3 parts by weight per 100 parts by weigh of resin A and resin B combined together. The antioxidants in any amount specified above will produce a satisfactory effect of heat resistance and exhibit good miscibility. They may be used alone or in combination with one another.

The foregoing adhesive composition may be incorporated with any known filler, such as silica, to improve its heat resistance. The amount of the filler will be up to 50 parts by weight per 100 parts by weight of resin A and resin B combined together.

In the case where the foregoing adhesive composition is in the form of solution, it may be applied to the support by any one method of spin coating, roll coating, die coating, printing, or dipping. This coating step is followed by prebaking at 80° C. to 200° C., preferably 100° C. to 180° C., depending on the volatility of the solvent. After solvent evaporation, there is obtained the adhesive composition layer.

In the case where the adhesive composition is in the form film, it may be applied to the support by lamination, so that the adhesive composition layer is formed on the support.

The layer of the adhesive composition which has been formed on the support as mentioned above subsequently undergoes heating for curing. The resulting cured layer functions as the adhesive layer. This curing reaction may be achieved after the wafer laminate has been formed. In this case, the layer of the adhesive composition is allowed to remain uncured until the wafer laminate is entirely heated afterward.

The adhesive layer to be formed on the support or wafer should have a thickness of 1 to 150 μm, preferably 5 to 100 μm. The thickness specified above is enough for light shielding and adhesion strength, and it is suitable for the bonded wafer to keep a flat surface.

The adhesive layer functions also as a light shielding layer, with the transmission of light (having a wavelength of 355 nm) being up to 20%, preferably up to 18%, and more preferably up to 15%. In addition, the adhesive layer should have an absorptivity such that the absorption maximum wavelength is 300 to 500 nm, preferably 300 to 400 nm. Moreover, the adhesive layer should preferably have a transmittance up to 20% for light with a wavelength ranging from 300 to 500 nm.

Method for Preparing the Wafer Laminate

According to the present invention, the method for preparing the wafer laminate includes the following steps (a) to (c).

Step (a)

Step (a) is intended to form the layer of the adhesive composition on the support or on that side of the wafer on which the circuits are formed. In the case where the adhesive composition is in the form of solution, it should be applied to the support by spin coating, roll coating, or the like, which is followed by prebaking at 80° C. to 200° C., preferably 100° C. to 180° C., depending on the volatility of the solvent. The prebaking evaporates the solvent, thereby forming the layer of the adhesive composition. In the case where the adhesive composition is in the form of film, it should be applied to the support by lamination, so that the layer of the adhesive composition is formed.

Step (b)

Step (b) is intended to bond under reduced pressure the layer of the adhesive composition to the support or that side of the wafer on which the circuits are formed. The reduced pressure should be 1 to 100 Pa, preferably 3 to 80 Pa. Moreover, this step should be performed at a temperature of 40° C. to 200° C., preferably 60° C. to 180° C. Bonding should be carried out under the conditions specified above, with the support or wafer being pressed evenly.

Step (c)

Step (c) is intended to perform heat curing on the layer of the adhesive composition which has been formed on the bonded wafer laminate prepared by in Step (b). The heat curing forms the adhesive layer. For this purpose, the wafer laminate prepared as mentioned above should be heated at 120° C. to 220° C., preferably 150° C. to 200° C., for ten minutes to four hours, preferably 30 minutes to two hours.

The support, the adhesive layer, and the wafer (having circuits on the surface thereof), which have been mentioned above, are combined together to form the wafer laminate.

Method for Preparing the Thin Wafer

The wafer laminate obtained by the method mentioned above should have its surface (with no circuits formed thereon) ground so as to produce the thin wafer.

The wafer laminate which has been made thin by grinding the back side has its side (with no circuit formed thereon) variously processed so that it is turned into the thin wafer laminate as desired. This object is achieved by using various processes which are commonly used for wafer fabrication. Such processes include the formation of electrodes, metal wirings, and protective films. Such objects are achieved by metal sputtering (to form electrodes), wet etching (on the layer formed by metal sputtering), resist application (to form a mask for metal wiring), patterning (by exposure and development), resist peeling, dry etching, metal plating, silicon etching (to form TSV), and formation of oxide film (on silicon surface).

The thin wafer can be peeled off from the wafer laminate by irradiation with a laser beam of 355 nm.

EXAMPLES

The present invention will be described below in more detail with reference to Synthesis Examples, Preparation Examples, Working Examples, and Comparative Examples, which are not intended to restrict the scope thereof. Incidentally, the weight-average molecular weight (Mw) in this invention is expressed in terms of the polystyrene conversion value measured by GPC which employs THF as the solvent. The compounds used in the following examples are identified as M-1 to M-4, which are represented by the formulas below.

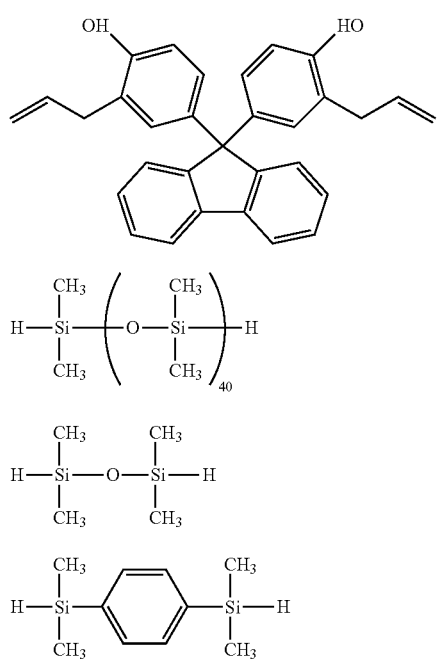

(M-1)
(M-2)
(M-3)
(M-4)

[1] Synthesis of Resin

Synthesis Example 1

A sample of Resin A1 was prepared in the following way. A 1,000-mL flask was charged with 1,5-dihydroxynaphthalene (80 g or 0.50 mol), 2-hydroxy-6-naphthoaldehyde (51.6 g or 0.30 mol), and methyl cellosolve (145 g). The flask was given 20 g of cellosolve solution containing 20 wt % of methyl p-toluenesulfonate, with stirring at 70° C. Stirring was continued at 85° C. for six hours. After cooling to room temperature, the contents were diluted with 800 mL of ethyl acetate. The diluted solution was transferred to a separatory funnel and washed repeatedly with 200 mL of deionized water to remove reaction catalysts and metal impurities. The resulting solution was concentrated under reduced pressure, and the residues were given 600 mL of ethyl acetate. The resulting solution was given 2,400 mL of hexane so that the resulting polymer was precipitated. The polymer precipitates were recovered by filtration and subsequently dried under reduced pressure. Thus there was obtained a sample of Resin A1 which includes repeating units represented by the formula below. Resin A1 was found to have an Mw of 3,200 and a degree of dispersion (Mw/Mn) of 2.44.

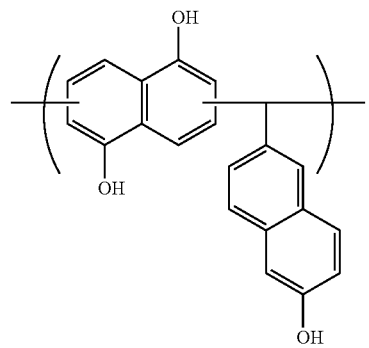

Synthesis Example 2

A sample of Resin A2 was prepared in the following way. A 1,000-mL flask was charged with 1,5-dihydroxynaphthalene (80 g or 0.50 mol), paraformaldehyde (9.0 g or 0.30 mol), and methyl cellosolve (145 g). The flask was given 20 g of cellosolve solution containing 20 wt % of methyl p-toluenesulfonate, with stirring at 70° C. Stirring was continued at 85° C. for six hours. After cooling to room temperature, the contents were diluted with 800 mL of ethyl acetate. The diluted solution was transferred to a separatory funnel and washed repeatedly with 200 mL of deionized water to remove reaction catalysts and metal impurities. The resulting solution was concentrated under reduced pressure, and the residues were given 600 mL of ethyl acetate. The resulting solution was given 2,400 mL of hexane so that the resulting polymer was precipitated. The polymer precipitates were recovered by filtration and subsequently dried under reduced pressure. Thus there was obtained a sample of Resin A2 which includes repeating units represented by the formula below. Resin A2 was found to have an Mw of 1,500 and a degree of dispersion (Mw/Mn) of 2.20.

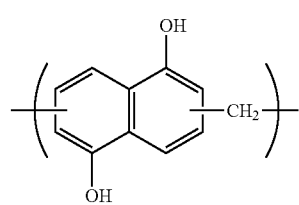

Comparative Synthesis Example 1

A sample of Resin A3 was prepared in the following way. A 1,000-mL flask was charged with 2-methylhydroxybenzene (32.4 g or 0.30 mol), 2-hydroxy-6-naphthoaldehyde (51.6 g or 0.30 mol), and methyl cellosolve (145 g). The flask was given 20 g of cellosolve solution containing 20 wt % of methyl p-toluenesulfonate, with stirring at 70° C. Stirring was continued at 85° C. for six hours. After cooling to room temperature, the contents were diluted with 800 mL of ethyl acetate. The diluted solution was transferred to a separatory funnel and washed repeatedly with 200 mL of deionized water to remove reaction catalysts and metal impurities. The resulting solution was concentrated under reduced pressure, and the residues were given 600 mL of ethyl acetate. The resulting solution was given 2,400 mL of hexane so that the resulting polymer was precipitated. The polymer precipitates were recovered by filtration and subsequently dried under reduced pressure. Thus there was obtained a sample of Resin A3 which includes repeating units represented by the formula below. Resin A3 was found to have an Mw of 2,100 and a degree of dispersion (Mw/Mn) of 1.58.

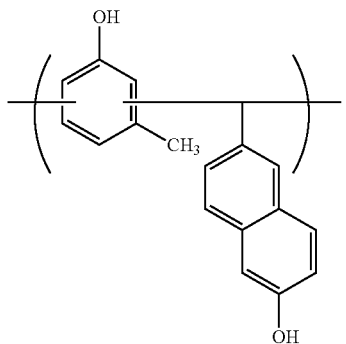

Synthesis Example 3

A sample of Resin B1 was prepared in the following way. A flask equipped with a stirrer, a thermometer, a nitrogen replacement unit, and a reflux condenser was charged with phenol compound (M-1) (43.1 g), compound (M-2) (29.5 g), toluene (126 g), and chloroplatinic acid (0.04 g). After heating up to 80° C., the flask was charged dropwise with compound (M-3) (11.4 g) over one hour. During this step, the temperature inside the flask rose to 85° C. This step was followed by aging at 80° C. for two hours. The reaction product was freed of toluene by distillation. The resulting residue was given 200 mL of methyl isobutyl ketone (MIBK). The resulting solution was given 2,000 mL of methanol so that the resulting polymer was precipitated. The polymer precipitates were recovered by filtration, followed by drying under reduced pressure. Thus there was obtained a sample of Resin B1, which was found to have an Mw of 45,000.

Synthesis Example 4

A sample of Resin B2 was prepared in the following way. A flask equipped with a stirrer, a thermometer, a nitrogen replacement unit, and a reflux condenser was charged with phenol compound (M-1) (43.1 g), compound (M-2) (29.5 g), toluene (134 g), and chloroplatinic acid (0.04 g). After heating up to 80° C., the flask was charged dropwise with compound (M-4) (14.6 g) over one hour. During this step, the temperature inside the flask rose to 83° C. This step was followed by aging at 80° C. for two hours. The reaction product was freed of toluene by distillation. The resulting residue was given 200 mL of MIBK. The resulting solution was given 2,000 mL of methanol so that the resulting polymer was precipitated. The polymer precipitates were recovered by filtration, followed by drying under reduced pressure. Thus there was obtained a sample of Resin B2, which was found to have an Mw of 34,000.

Comparative Synthesis Example 2

A sample of Resin B3 was prepared in the following way. A flask equipped with a stirrer, a thermometer, a nitrogen replacement unit, and a reflux condenser was charged with phenol compound (M-1) (43.1 g), toluene (92 g), and chloroplatinic acid (0.04 g). After heating up to 80° C., the flask was charged dropwise with compound (M-4) (18.5 g) over one hour. During this step, the temperature inside the flask rose to 82° C. This step was followed by aging at 80° C. for two hours. The reaction product was freed of toluene by distillation. The resulting residue was given 200 mL of MIBK. The resulting solution was given 2,000 mL of methanol so that the resulting polymer was precipitated. The polymer precipitates were recovered by filtration, followed by drying under reduced pressure. Thus there was obtained a sample of Resin B3, which was found to have an Mw of 20,000.

Comparative Synthesis Example 3

A sample of Resin B4 was prepared in the following way. A flask equipped with a stirrer, a thermometer, a nitrogen replacement unit, and a reflux condenser was charged with phenol compound (M-1) (10.8 g), toluene (123 g), and chloroplatinic acid (0.04 g). After heating up to 80° C., the flask was charged dropwise with compound (M-2) (71.4 g) over one hour. During this step, the temperature inside the flask rose to 81° C. This step was followed by aging at 80° C. for two hours. The reaction product was freed of toluene by distillation. The resulting residue was given 200 mL of MIBK. The resulting solution was given 2,000 mL of methanol so that the resulting polymer was precipitated. The polymer precipitates were recovered by filtration, followed by drying under reduced pressure. Thus there was obtained a sample of Resin B4, which was found to have an Mw of 25,000.

[2] Preparation of Adhesive Composition

Preparation Examples 1 to 5 and Comparative Preparation Examples 1 to 3

Any one of Resins A1 to A3 was mixed with any one of Resin B1 to B4 in the ratio depicted in Table 1 so that the total amount was 100 g. Each of the resulting mixtures was incorporated with the following ingredients, whose amounts are depicted in Table 1.

Crosslinking agent epoxy crosslinking agent (TM: EOCN-1020 from Nippon Kayaku Co., Ltd.)
Hardening catalyst: bis(tert-butylsulfonyl)diazomethane (TM: BSDM from Wako Pure Chemical Industries Ltd.)
Antioxidant: tetrakis[methylene-(3,5-di-tert-butyl-4-hydroxyhydrocinnamate)]-methane (TM: Adkstab AO-60)
Solvent: cyclohexanone After filtration through a membrane filter (1 μm), there were obtained the adhesive compositions A to H.

TABLE 1

|  | Preparation Example ||||| Comparative Preparation Example |||
| --- | --- | --- | --- | --- | --- | --- | --- | --- |
|  | 1 | 2 | 3 | 4 | 5 | 1 | 2 | 3 |
| Adhesive composition | A | B | C | D | E | F | G | H |
| Resin A | A1 | A1 | A1 | A1 | A2 | A1 | A1 | A3 |
| Resin B | B1 | B1 | B1 | B2 | B2 | B3 | B4 | B1 |
| Ratio of Resin A/Resin B | 20/80 | 30/70 | 40/60 | 40/60 | 40/60 | 40/60 | 40/60 | 40/60 |
| Total amount of Resin A and Resin B (g) | 100 | 100 | 100 | 100 | 100 | 100 | 100 | 100 |
| EOCN-1020 (g) | 5 | 5 | 5 | 5 | 5 | 5 | 5 | 5 |
| BSDM (g) | 0.2 | 0.2 | 0.2 | 0.2 | 0.2 | 0.2 | 0.2 | 0.2 |
| AO-60 (g) | 0.1 | 0.1 | 0.1 | 0.1 | 0.1 | 0.1 | 0.1 | 0.1 |
| Cyclohexanone (mL) | 100 | 85 | 70 | 65 | 65 | 60 | 60 | 70 |

[3] Preparation and Evaluation of Wafer Laminate

Examples 1 to 5 and Comparative Examples 1 to 3

Each of the adhesive compositions A to H was applied by spin coating onto a glass plate, 200 mm in diameter and 500 pun thick. The coated glass plate was heated at 150° C. for five minutes on a hot plate. Thus, there was obtained a glass plate coated with a layer of the adhesive composition, the layer having a thickness depicted in Table 2.

The coated glass plate was placed on a silicon wafer, 200 mm in diameter and 725 μm thick, in such a way that the layer of the adhesive composition faces that side of the wafer which supports on its entire surface copper posts, each measuring 10 μm in height and 40 μm in diameter. This step was accomplished by using a vacuum laminating machine (EVG520IS, made by EVG Group) under the following conditions.

Pressure of atmosphere: up to 0.1 Pa
Temperature: depicted in Table 2.
Load: 5 kN Thus there was obtained a wafer laminate.

The wafer laminate (including of the glass plate and the silicon wafer which are bonded together) was examined for performance as follows. The results are depicted in Table 2. The items of evaluation are depicted below.

(1) Bond Strength

The bonding between the glass plate and the silicon wafer was accomplished by using the wafer laminating machine (EVG520IS, from EVG Group) under the following conditions.

Bonding temperature: depicted in Table 2
Pressure in chamber for bonding: up to 0.1 Pa
Load: 5 kN
Duration: one minute After bonding, the laminate was heated at 180° C. for one hour in an oven, so as to cure the layer of the adhesive composition. After cooling to room temperature, the interface was inspected for bonding by visual observation or through an optical microscope. The bonding is rated as good (O) if no anomaly (such as bubbles) is found, and the bonding is rated as poor (X) if any anomaly is found.

(2) Resistance to Backside Grinding

The silicon wafer had its backside ground with a diamond grindstone (DAG810, from DISCO Corporation). Grinding was carried out so that the thickness of the wafer was reduced to 50 μm. The wafer was inspected for anomaly (such as cracking and peeling) through an optical microscope (×100). The grinding is rated as good (O) if no anomaly is found, and the grinding is rated as poor (X) if any anomaly is found.

(3) Resistance to CVD

The laminate which has undergone the grinding of the backside of the silicon wafer was placed in a CVD apparatus for deposition of $SiO_2$ film (2 μm thick). The silicon wafer was inspected for anomaly in external appearance. The silicon wafer is rated as good (O) in resistance to CVD if no anomaly (such as wafer breakage) is found in external appearance, and the silicon wafer is rated as poor (X) if any anomaly (such as voids, swelling, and breakage) is found in external appearance. The test for resistance to CVD was carried out under the following conditions.

Apparatus: plasma CVD, PD270STL (made by Samco Inc.)
RF: 500 W
Inside pressure: 40 Pa
TEOS (tetraethylorthosilicate): $O_2$=20 sccm:680 sccm (4) Separability of Support The support was tested for separability in the following way. The thinned wafer laminate which has undergone CVD resistance test has its ground side partly stuck with a dicing tape using a dicing frame. Then the wafer laminate is set on a suction pad such that the side to which the dicing tape sticks is sucked. Subsequently the wafer laminate is irradiated all over the surface with a laser beam (355 nm) through the support. The wafer laminate is rated as good (O) in separability if it is separated without the support and wafer (ground to 50 μm) breaking, and the wafer laminate is rated as poor (X) in separability if any anomaly (such as cracking) occurs during separation.

(5) Peelability of Adhesive Layer

The adhesive layer was tested for peelability in the following way. First, the wafer laminate which has undergone the peel test for the support has its adhesive layer stuck with a peeling tape. Next, the peeling tape is pulled up so that the adhesive layer peels off from the wafer. The adhesive layer is rated as good (O) in peelability if it peels off without breaking the thinned wafer (50 nm thick) and without leaving any residues; and the adhesive layer is rated as poor (X) in peelability if it causes any anomaly such as cracking and residues during peeling.
(6) Peeling Force The adhesive layer was tested for force required for peeling in the following way. A solution of the adhesive composition was applied to the silicon wafer by spin coating. The coated wafer was heated at 150° C. for five minutes on a hot plate and further heated at 180° C. for one hour in an oven, so that the wafer was covered with a cured adhesive layer having a film thickness depicted in Table 2.

The adhesive layer on the wafer was stuck with five pieces of polyimide tape, 150 mm long and 24 mm wide. That part of the adhesive layer which is not stuck with the polyimide tape was removed. The adhesive tape was peeled at a rate of 300 mm/minute over a length of 120 mm by turning 180°. The force required for peeling was measured using AUTOGRAPH (AG-I) made by Shimadzu Corporation. An average of five measurements was regarded as the force required for the adhesive layer to be peeled off.
(7) Light Transmission The adhesive layer was tested for light transmission in the following way. A solution of the adhesive composition was applied onto a glass plate, 500 pun thick, by spin coating. The coated glass plate was heated at 150° C. for five minutes on a hot plate and further heated at 180° C. for one hour in an oven, so that the glass plate was covered with a cured adhesive layer having a film thickness of 0.3 μm. The cured adhesive layer was examined for transmission of light (with a wavelength of 355 nm) by using a spectrophotometer (U-4100, made by Hitachi High-Tech Science Corporation). Any sample is rated as good (O) if it has a light transmission up to 20%, and any sample is rated as poor (X) if it has a light transmission higher than 20%.

the support does not separate but breaks after laser irradiation. Incidentally, the wafers in Examples 1 to 5 were examined for surface by SEM-EDX after washing, and it was found that their contamination with metals (such as Ca, K, Na, Mg, Mn, and Pb) is practically negligible.

In the meantime, the foregoing examples are intended to merely illustrate the invention but not to restrict the scope of the invention. The present invention embraces in its scope any technical idea substantially identical with those described in the claims thereof and those which will produce the same effects as it will produce.

Although some preferred embodiments have been described, many modifications and variations may be made thereto in light of the above teachings. It is therefore to be understood that the invention may be practiced otherwise than as specifically described without departing from the scope of the appended claims.

Japanese Patent Application No. 2016-199829 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wafer laminate comprising a support, an adhesive layer formed on the support, and a wafer which is laminated on the adhesive layer in such a way that a surface of the

TABLE 2

| | | Example | | | | | Comparative Example | | |
| --- | --- | --- | --- | --- | --- | --- | --- | --- | --- |
| | | 1 | 2 | 3 | 4 | 5 | 1 | 2 | 3 |
| Adhesive composition | | A | B | C | D | E | F | G | H |
| Thickness of layer of adhesive composition | | 60 μm | 60 μm | 60 μm | 60 μm | 60 μm | 60 μm (Cracked) | — (Separated) | 60 μm |
| Uniformity of thickness of layer of adhesive composition | | <1 μm | <1 μm | <2 μm | <2 μm | <2 μm | — | — | <1 μm |
| Content of siloxane in Resin B (wt %) | | 49 | 49 | 49 | 51 | 51 | 0 | 87 | 49 |
| Content of siloxane in adhesive layer (wt %) | | 31 | 28 | 23 | 24 | 24 | 0 | 41 | 23 |
| Light transmission of adhesive layer | | O (12%) | O (8%) | O (5%) | O (6%) | O (8%) | — | — | X (45%) |
| Force required for adhesive layer to peel off from silicon wafer | | 5 gf | 7 gf | 10 gf | 9 gf | 9 gf | — | — | 20 gf |
| Bonding temperature | | 110° C. | 110° C. | 110° C. | 120° C. | 130° C. | — | — | 110° C. |
| Bonding performance | Visual observation | O | O | O | O | O | — | — | O |
| | Optical microscope | O | O | O | O | O | — | — | O |
| Backside grindablity | | O | O | O | O | O | — | — | O |
| CVD resistance | | O | O | O | O | O | — | — | O |
| Separability of support | | O | O | O | O | O | — | — | X |
| Peelability | | O | O | O | O | O | — | — | — |

Table 2 indicates that Examples 1 to 5 produce good results in temporary adhesion and peelability. By contrast, Comparative Example 1 indicates a result that the adhesive film suffers cracking after application because Resin B does not contain siloxane. Comparative Example 2 indicates a result that the mixture of Resin A and Resin B separates from each other because Resin B contains siloxane in an excessive amount. Comparative Example 3 indicates a result that wafer which has a circuit surface faces toward the adhesive layer,
wherein the adhesive layer is a cured product of an adhesive composition comprising resin A and resin B, the resin A consisting of repeating units represented by the following formula (1) and having a weight-average molecular weight of 500 to 500,000, and the resin B containing a siloxane skeleton:

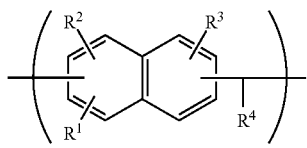
(1)

wherein $R^1$ to $R^3$ are independently a hydrogen atom, a hydroxyl group, and a monovalent organic group having 1 to 20 carbon atoms, with at least one of $R^1$ to $R^3$ being a hydroxyl group, and $R^4$ is a hydrogen atom or a monovalent organic group having 1 to 30 carbon atoms, which may have a substituent.

2. The wafer laminate of claim 1, wherein the adhesive layer has a transmittance up to 20% for light having a wavelength of 355 nm.

3. A wafer laminate comprising a support, an adhesive layer formed on the support, and a wafer which is laminated on the adhesive layer in such a way that a surface of the wafer which has a circuit surface faces toward the adhesive layer,
wherein the adhesive layer is a cured product of an adhesive composition comprising resin A and resin B, the resin A containing repeating units represented by the following formula (1) and having a weight-average molecular weight of 500 to 500,000, and the resin B containing a siloxane skeleton:

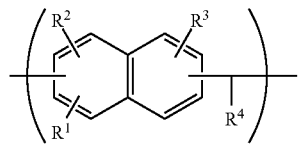
(1)

wherein $R^1$ to $R^3$ are independently a hydrogen atom, a hydroxyl group, and a monovalent organic group having 1 to 20 carbon atoms, with at least one of $R^1$ to $R^3$ being a hydroxyl group, and $R^4$ is a hydrogen atom or a monovalent organic group having 1 to 30 carbon atoms, which may have a substituent,
wherein the resin B is a phenol-modified silicone resin comprising repeating units represented by the formula (2) below, and optionally repeating units represented by the formula (3) below, and having a weight-average molecular weight of 3,000 to 500,000:

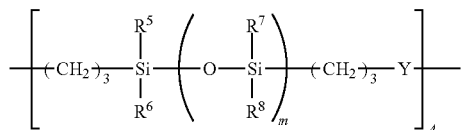
(2)

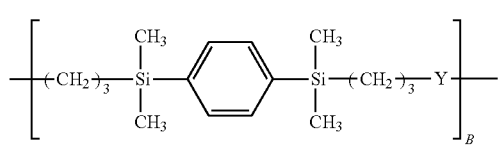
(3)

wherein $R^5$ to $R^8$ are independently a monovalent hydrocarbon group having 1 to 8 carbon atoms; m is an integer of 1 to 100; A and B satisfy $0<A\leq 1$, $0\leq B<1$, and $A+B=1$; Y is a divalent organic group represented by the formula (4) below;

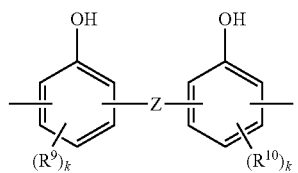
(4)

wherein Z is a single bond or a divalent organic group selected from the following formulas,

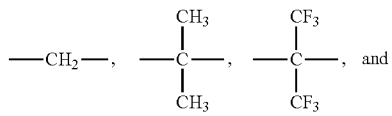

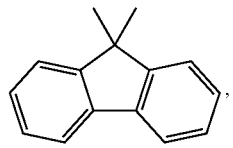

$R^9$ and $R^{10}$ are independently a linear, branched, or cyclic alkyl group having 1 to 4 carbon atoms, or a linear, branched, or cyclic alkoxy group; and k is 0, 1, or 2.

4. The wafer laminate of claim 1, wherein the adhesive composition further comprises a crosslinking agent.

5. The wafer laminate of claim 1, wherein the adhesive composition further comprises an organic solvent.

6. An adhesive composition comprising a resin consisting of repeating units represented by formula (1) below and having a weight-average molecular weight of 500 to 500,000, and a resin containing a siloxane skeleton:

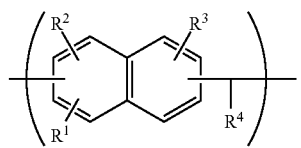
(1)

wherein $R^1$ to $R^3$ are independently a hydrogen atom, a hydroxyl group, and a monovalent organic group having 1 to 20 carbon atoms, with at least one of $R^1$ to $R^3$ being a hydroxyl group, and $R^4$ is a hydrogen atom or a monovalent organic group having 1 to 30 carbon atoms, which may have a substituent.

7. The wafer laminate of claim 1, wherein the resin B is a silicone resin.

8. The adhesive composition of claim 6, wherein the resin containing a siloxane skeleton is a silicone resin.

9. An adhesive composition comprising
a resin containing repeating units represented by the following formula (1) and having a weight-average molecular weight of 500 to 500,000, and
a resin containing a siloxane skeleton that is a phenol-modified silicone resin comprising repeating units represented by the formula (2) below, and optionally repeating units represented by the formula (3) below, and having a weight-average molecular weight of 3,000 to 500,000:

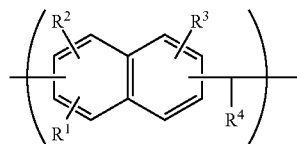
(1)

wherein $R^1$ to $R^3$ are independently a hydrogen atom, a hydroxyl group, and a monovalent organic group having 1 to 20 carbon atoms, with at least one of $R^1$ to $R^3$ being a hydroxyl group, and $R^4$ is a hydrogen atom or a monovalent organic group having 1 to 30 carbon atoms, which may have a substituent,

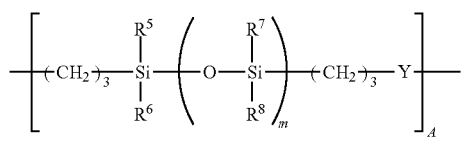
(2)

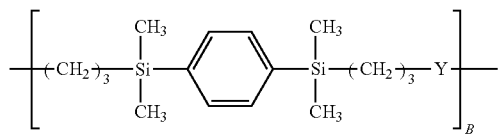
(3)

wherein $R^5$ to $R^8$ are independently a monovalent hydrocarbon group having 1 to 8 carbon atoms; m is an integer of 1 to 100; A and B satisfy $0<A\leq1$, $0\leq B<1$, and $A+B=1$; Y is a divalent organic group represented by the formula (4) below;

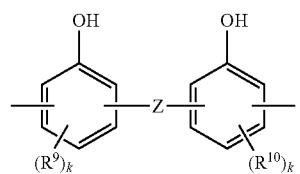
(4)

wherein Z is a single bond or a divalent organic group selected from the following formulas,

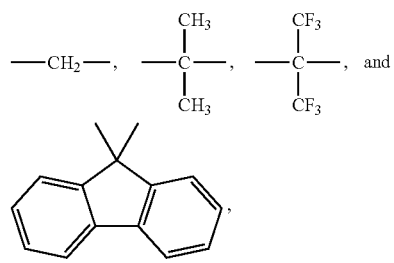

$R^9$ and $R^{10}$ are independently a linear, branched, or cyclic alkyl group having 1 to 4 carbon atoms, or a linear, branched, or cyclic alkoxy group; and k is 0, 1, or 2.

* * * * *